United States Patent [19]

Saikawa et al.

[11] Patent Number: 4,501,811
[45] Date of Patent: Feb. 26, 1985

[54] PROCESS FOR MAKING LITHOGRAPHIC PRINTING PLATES

[75] Inventors: Masahiko Saikawa; Eiji Kanada; Akira Tanaka; Kazunaka Endo, all of Nagaokakyo, Japan

[73] Assignee: Mitsubishi Paper Mills, Ltd., Tokyo, Japan

[21] Appl. No.: 541,656

[22] Filed: Oct. 13, 1983

[30] Foreign Application Priority Data

Oct. 16, 1982 [JP] Japan ................................. 57-181756
Jul. 18, 1983 [JP] Japan ................................. 58-131388

[51] Int. Cl.³ .......................... G03C 5/54; G03C 1/19
[52] U.S. Cl. .................................. 430/204; 430/230; 430/246; 430/588; 430/945
[58] Field of Search ............... 430/204, 230, 246, 363, 430/588, 585, 586, 945

[56] References Cited

U.S. PATENT DOCUMENTS

| 3,177,210 | 4/1965 | Rosenoff | 430/588 |
| 3,459,553 | 8/1969 | Walworth | 430/588 |
| 3,776,739 | 12/1973 | Sato et al. | 430/588 |
| 3,867,146 | 2/1975 | Nakazawa et al. | 430/945 |
| 4,134,769 | 1/1979 | Yoshida et al. | 430/204 |

Primary Examiner—Richard L. Schilling
Attorney, Agent, or Firm—Cushman, Darby & Cushman

[57] ABSTRACT

Disclosed is a process for making a lithographic printing plate by utilizing the silver complex diffusion transfer process and using a neon-helium laser or an LED which comprises imagewise exposing to the radiation a photosensitive element including an emulsion layer which is spectrally sensitized with an anion- or betaine-type meso-substituted trimethine cyanine dye having at least one $\beta$-naphthothiazole nucleus and developing the element by the silver complex diffusion transfer process.

9 Claims, No Drawings

PROCESS FOR MAKING LITHOGRAPHIC PRINTING PLATES

BACKGROUND OF THE INVENTION

This invention relates to a process for making a lithographic printing plate, which involves the scanning exposure technique to achieve high-intensity short-time exposure and the silver complex diffusion transfer development process. It relates also to a plate-making and printing method using such a printing plate.

A lithographic printing plate which utilizes as ink receptive areas a transferred silver image produced by the silver complex diffusion transfer process has already been known to the art by the disclosure of Japanese Patent Publication No. 30,562/73 and Japanese Patent Application "Kokai" (Laid-open) Nos. 21,602/78, 103,104/79 and 9,750/81.

In a typical embodiment of the silver complex diffusion transfer process suitable for making a lithographic printing plate, a silver image is formed in the following way: When a photosensitive material comprising a support and, disposed successively thereon, a subbing layer which serves also as antihalation layer, a silver halide emulsion layer, and a physical development nuclei layer is imagewise exposed and developed, the silver halide in the areas where a latent image has been formed changes into developed silver in the emulsion layer. At the same time, the silver halide in the areas where a latent image has not been formed dissolves by the action of a silver halide complexing agent contained in the developer and diffuses toward the surface. The dissolved and diffused silver complex is precipitated by the reducing action of the developing agent on the physical development nuclei in the surface layer to form a silver image. After the development, if necessary, the silver image is subjected to sensitization treatment to enhance its ink receptivity. The material thus treated is mounted on an offset press and the inked image is transferred to a print material.

In the conventional process, the silver halide emulsion layer is spectrally sensitized with a merocyanine dye, cyanine dye, or the like so as to show a sensitivity maximum at around 550 nm in the green region. The emulsion layer is exposed in a process camera to a customary light source such as a tungsten bulb for several seconds to several tens of seconds. A printing plate obtained in such a way, however, exhibited only limited sharpness and resolving power, even though an aforementioned sensitive material inherently excellent in these properties has been used. Moreover, in reproducing a color print from a color original, the conventional process has disadvantages in that both procedures of preparing the sensitive material and making a printing plate are troublesome in addition to the insufficient resolving power.

A conceivable idea to overcome the above difficulties is that the photosensitive material is given a exposure by means of a scanning exposure technique; namely, the material is exposed momentarily (a period of $10^{-5}$ second or less) to high-intensity light sources including various lasers such as neon-helium laser, light-emitting diodes (LED) and cathode ray tubes (CRT), whereby direct printing plate making becomes possible. There have been disclosed in many patents those photographic materials which are sensitized with dyes suitable for lasers used as light source. Although realized in other fields, such photographic materials are not yet actually used in the field of lithographic printing plate which utilizes the silver complex diffusion transfer process. Among others, a technical reason for this is the difficulty of obtaining a silver halide emulsion exhibiting a sensitivity and a resolving power sufficiently high for practical use. It is known that a high-intensity momentary exposure gives rise to so-called high intensity reciprocity law failure, resulting in deterioration in both sensitivity and graduation. In addition, as compared with the common silver halide photosensitive materials, in the sensitive material for lithographic printing plate utilizing the silver complex diffusion transfer process, the physical development nuclei layer greatly affects the spectral sensitization and, as a consequence, there is resulted a decrease in the sensitivity to a laser exposure or deterioration in the shelf stability. Since the silver complex diffusion transfer process produces a transferred and precipitated silver image of soft gradation, there occur a decrease in both sharpness and resolution of the image, scumming, and worn-off of the silver image during printing. These defects result in insufficient printing endurance and detract much from the printing plate quality. A desirable sensitizing dye should meet the following requirements: sufficiently high sensitivity to the radiation wave-lengths from lasers; good shelf stability; formation of a transferred and precipitated silver image of high contrast; no adverse effect such as scumming; and formation of a transferred and precipitated silver image having a sufficient adherence to keep even small silver particles from worn-off during the printing operation.

As for the lasers, there are many types using various media such as ruby, neon-helium gas, argon gas, krypton gas, cadmium vapor, and gaseous carbon dioxide. Of these madia, the neon-helium gas is widely used because of its lowest cost and the steadiness of laser output. The radiation wave-length from a neon-helium laser is 632.8 nm. For instance, in making a lithographic printing plate by means of an electronic color scanner, the silver halide emulsion layer should have a high sensitivity to 632.8 nm radiation from the laser, in addition to other required properties mentioned above.

Silver halide photosensitive materials containing sensitizing dyes suitable for the neon-helium laser exposure are disclosed by Japanese Patent Publication Nos. 17,725/74, 39,818/80, and 15,011/80. These sensitizing dyes generally show sensitivity maxima in the range of from 625 to 660 nm which covers the wavelength, 632.8 nm, of neon-helium laser. Almost all of such dyes, however, are unsatisfactory in meeting all of the aforementioned requirements for the present lithographic printing plate. It was found that the sensitizing dyes given hereinafter can be satisfactorily used in the photosensitive material to be exposed to a laser beam.

The light-emitting diode (LED) is inferior in the output to the neon-helium laser. Consequently, the photosensitive material is required to be of higher sensitivity and contrast, excellent in sharpness and resolving power, and capable of producing a printing plate resistant to scumming and worn-off of the silver image. The sensitizing dye used in such a photosensitive material should have not only sufficiently high sensitivity to a wavelength range of beams from steadily utilizable LED's, i.e. about 660 to about 730 nm (the wavelength width of any particular LED radiation is about 15 nm) but also other required properties including good shelf stability, ability to form a high-contrast silver image, no adverse effect such as scumming, and capability of forming a silver image having sufficient adherence to keep even tiny silver particles from worn-off during the printing operation.

It is described in U.S. Pat. No. 4,134,769 that when a betain- or anion-type cyanine dye is used, there is obtained an offset printing plate having a high sensitivity and improved printing characteristics and that to obtain a high sensitivity, it is desirable to use a silver halide emulsion of a high silver bromide content. On the other hand, it is known that in the case of a high-intensity short-time exposure, a silver halide emulsion of high silver chloride content is inferior in spectral sensitization effect to that of a low silver chloride content (e.g. Japanese Patent Publication No. 42,172/73); it is also known that such an emulsion is more susceptible to high-intensity reciprocity law failure [e.g. Photographic Science and Engineering, Vol. 26 (1982)]. It may be said, therefore, that an emulsion of high silver chloride content is unsuitable for a scanning exposure using a laser or LED as light source.

SUMMARY OF THE INVENTION

Primary objects of this invention are to provide a process for making a lithographic printing plate by utilizing the silver complex diffusion transfer process and using a neon-helium laser as light source from a photographic element capable of steadily retaining for a long period of time a high sensitivity, high contrast, high sharpness, high resolving power and exhibiting a high printing endurance, said photographic element being suitable also for high-quality color printing by simple direct processing; and to provide a combination of the above process and a method of printing.

Further objects of this invention are to provide a process for making a lithographic printing plate by utilizing the silver complex diffusion transfer process from a photographic element which is highly sensitive to the exposure using LED as light source and which exhibits desirable printing characteristics; and to provide a combination of the above process and a method of printing.

The above objects have been attained by using an anion- or betaine-type meso-substituted trimethine cyanine dye having at least one β-naphthothiazole nucleus as a sensitizing dye used in silver halide emulsion layer of said lithographic printing plates and by imagewise exposing the layer to the radiation from a non-helium laser or a light-emitting diode and then subjecting the layer to silver complex diffusion transfer development.

DESCRIPTION OF THE INVENTION

Desirable sensitizing dyes for use in the present process are those represented by the general formula (I):

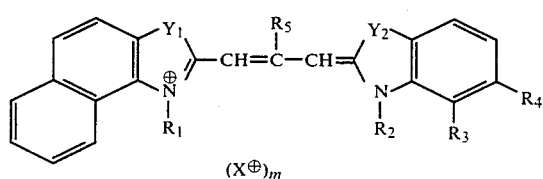

wherein $R_1$ and $R_2$ each represents an alkyl group (e.g. methyl, ethyl, propyl, butyl, β-sulfoethyl, γ-sulfopropyl, γ-sulfobutyl, vinylmethyl, β-carboxyethyl, γ-carboxypropyl, δ-carboxybutyl group, etc.), an alkenyl group, an aryl group, or an aralkyl group, at least one of $R_1$ and $R_2$ is a group having a sulfo or carboxyl group; $R_3$ and $R_4$ each represents a hydrogen atom, an alkyl group, an alkoxy group, an aryl group, a hydroxyl group, alkoxycarbonyl group or a halogen atom, $R_3$ and $R_4$ may jointly form a benzene ring; $R_5$ represents an alkyl group, an aryl group, or an aralkyl group; $Y_1$ and $Y_2$ each represents a sulfur or selenium atom, provided that $Y_1$ and $Y_2$ are no simultaneously a selenium atom; X represents a cationic form of a hydrogen atom, an alkali metal atom, an ammonium group, etc.; and m is 1 or 0.

Examples of typical sensitizing dyes used in the present invention are as shown below.

Dye No.

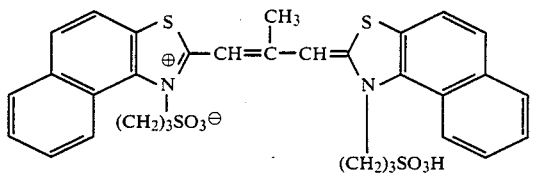

1

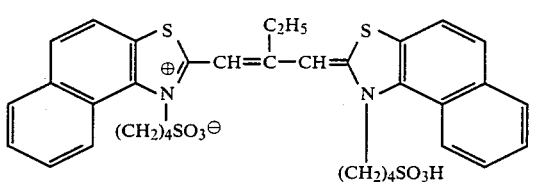

2

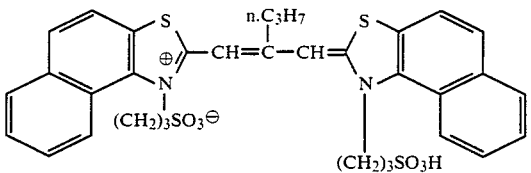

3

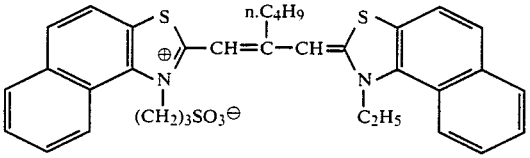

4

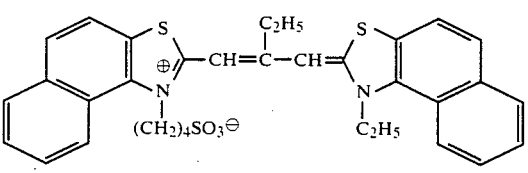

5

-continued

| Dye No. |
|---|
| 6 |
| 7 |
| 8 |
| 9 |

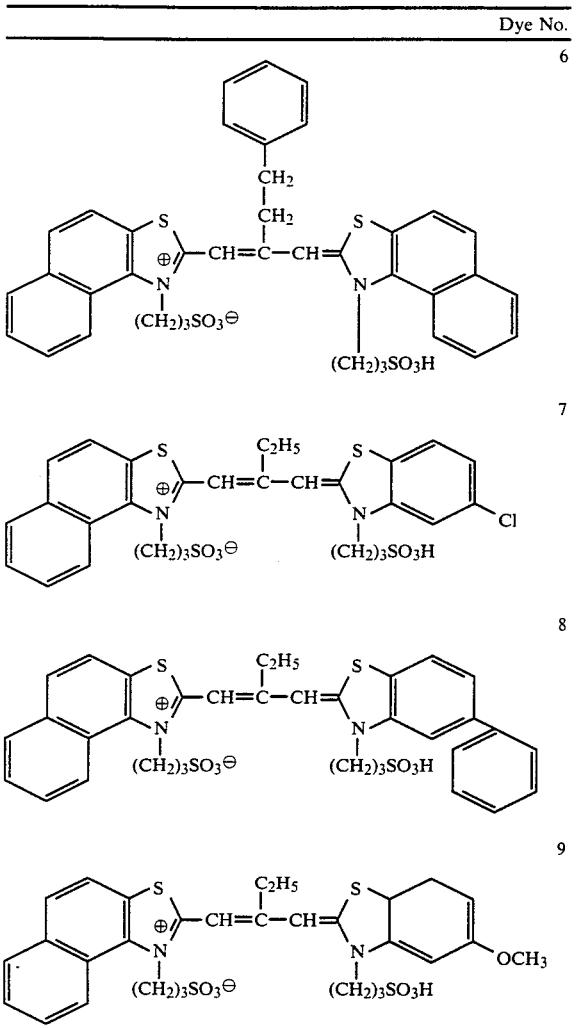

Dye used for comparison were as shown below.

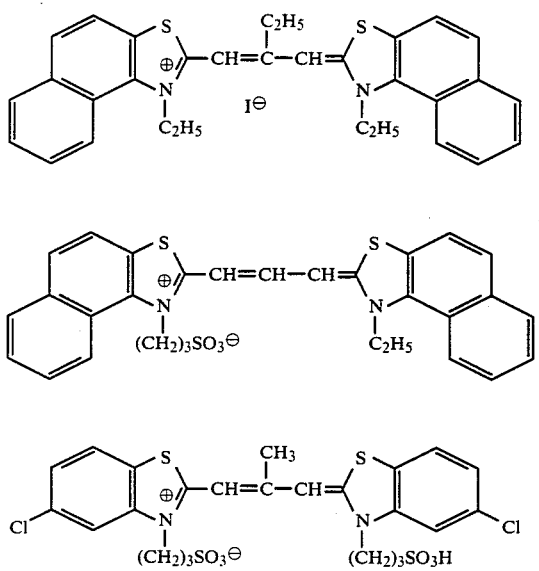

A

B

C

-continued

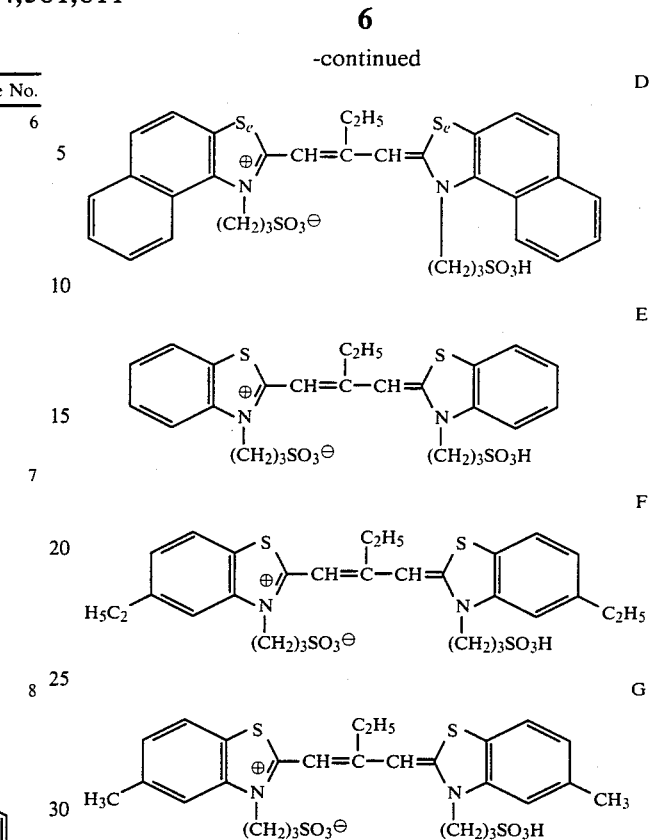

D

E

F

G

The sensitizing dyes used in this invention can be synthesized by the methods known to those skilled in the art. The dye can be added to the silver halide emulsion at any time before coating the emulsion. The amount to be added can be varied in a wide range, but is generally in the range of from $1 \times 10^{-5}$ to $1 \times 10^{-2}$ mole for 1 mole of silver halide, the optimum amount being dependent upon the type of silver halide such as, for example, halogen composition, average grain size as well as crystal habit of the silver halide.

The silver halides in the emulsion layer of the present photographic element contain 70 mol% or more, preferably 80 mol% or more in terms of silver chloride of silver chloride, silver chlorobromide or silver bromoiodochloride. The average grain size of these silver halides is preferably in the range of 0.2 to 0.6μ, though other grain sizes are usable. The emulsion is preferably monodispersion of silver halide grains, 90% or more of total grains having a size within ±30% of the average size. The grains are preferably in the form of substantially cube or fourteenfaced polyhedron, though those having other crystal habits are not objectionable.

The binder used in the present silver halide emulsion is usually gelatin which can be partially replaced by one or more hydrophilic polymer binders such as starch, albumin, sodium alginate, hydroxyethylcellulose, gum arabic, polyvinyl alcohol, polyvinyl pyrrolidone, carboxymethylcellulose, polyacrylamide, styrene-maleic anhydride copolymer, and polyvinyl methyl ether-maleic anhydride copolymer. It is further possible to use an aqueous dispersion (latex) of vinyl polymers.

The silver halide emulsion can be sensitized in various ways during its manufacture or coating. The emulsion is preferably sensitized chemically by the methods well known to the art by using, for example, sodium thiosulfate, alkylthioureas, or gold compounds (e.g.

gold rhodanide and gold chloride or a mixture thereof). Those characteristics such as high sensitivity, high sharpness, and high resolving power which are especially desirable for the direct processing printing plate may be imparted by adding at any time during the emulsion manufacture compounds of metals of Group VIII of the periodic table, such as, for example, salts of cobalt, nickel, rhodium, palladium, iridium, and platinum. The amount to be added is in the range of $10^{-8}$ to $10^{-3}$ mole for 1 mole of silver halide. The silver halide emulsion layer may contain other additives such as, for example, coating aids, antifoggants, matting agents (water-holding agents), and developing agents which are customarily used.

Underneath the silver halide emulsion layer, (i.e. on the support), there may be provided a subbing layer to improve the adhesion and an undercoating layer for the purpose of antihalation or the like. These layers may contain a developing agent or a matting agent.

The photosensitive material used in this invention is provided with an image receiving layer containing known physical development nuclei such as metals including antimony, bismuth, cadmium, cobalt, palladium, nickel, tin, lead, and zinc and sulfides thereof. The image receiving layer may or may not contain hydrophilic colloids such as gelatin, carboxymethylcellulose, gum arabic, sodium alginate, hydroxyethylstarch, dextrin, hydroxyethylcellulose, polystyrenesulfonic acid, vinylimidazole-acrylamide copolymer, and polyvinyl alcohol in an amount of preferably 0.1 g or less per square meter. The image receiving layer may further contain hygroscopic substances or wetting agents such as sorbitol and glycerol. It may contain also anti-scumming pigments such as barium sulfate, titanium dioxide, China clay, and silver, developing agents such as hydroquinone and hardeners such as formaldehyde.

The supports can be paper; films such as, for example, cellulose acetate film, polyvinyl acetal film, polystyrene film, polypropylene film, and polyethylene terephthalate film; composite films such as polyester, polypropylene, or polystyrene film coated with polyethylene film; metals; metallized paper; or metal-paper laminates. A paper support coated on one or both sides with an α-olefin polymer such as polyethylene is also useful. These supports may contain an antihalation dye or pigment.

The DTR processing solution used in this invention may contain alkaline substances such as, for example, sodium hydroxide, potassium hydroxide, lithium hydroxide, and trisodium phosphate; preservatives such as sulfites; silver halide solvents such as for example, thiosulfates, thiocyanates, cyclic imides, thiosalicylic acid, and amines; thickeners such as, for example hydroxyethylcellulose and carboxymethylcellulose; antifoggants such as, for example, potassium bromide, 1-phenyl-5-mercaptotetrazole, and compounds described in Japanese Patent Application "Kokai" (Laid-open) No. 26,201/72; developing agents such as, for example, hydroquinone and 1-phenyl-3-pyrazolidone; and development modifiers such as, for example, polyoxyalkylene compounds and onium compounds.

Since the photosensitive material used in this invention is developed by the silver complex diffusion transfer process, the silver halide emulsion layer and/or the image receiving layer and other water permeable layers contiguous to the image receiving layer may contain a developing agent as described, for example, in Brit. Pat. Nos. 1,000,115, 1,012,476, 1,017,273, and 1,042,477. Therefore, in developing such a material, use may be made of a so-called "alkaline activating solution" containing no developing agent.

The lithographic printing plate prepared according to the present invention is rendered ink receptive or is enhanced in ink receptivity by use of such compounds as are described in Japanese Patent Publication No. 29,723/73 and U.S. Pat. No. 3,721,539. The printing method, etch (desensitizing) solution, or fountain solution is similar to those generally known to the art.

The invention is described below in detail with reference to Examples, but the invention is, of course, not limited thereto.

EXAMPLE 1

On one side of a subbed polyester film support, was provided a matting layer containing powdered silica of 5μ in average particle size. On the opposite side, was provided an antihalation undercoat (adjusted to pH 4.0) containing carbon black and 20% by weight based on the photographic gelatin of powdered silica, 7μ in average particle size. Onto the undercoat, was then applied a silver chloride emulsion layer (adjusted to pH 4.0) containing 5% by weight (based on photographic gelatin) of powdered silica, 7μ in average particle size, which has been chemically sensitized with a gold compound and then spectrally sensitized. The application rate of gelatin in the undercoat was 3.0 g/m², that of gelatin in the emulsion layer 1.0 g/m², and that of silver halide 1.0 g/m² in terms of silver nitrate. Both the undercoat and the emulsion layer contained 5.0 mg of formaldehyde as hardener for 1 g of gelatin. After drying, the coated support was heated at 40° C. for 14 days. The emulsion layer was then coated with a nuclei coating composition described in Example 2 of Japanese Patent Application "Kokai" (Laid-open) No. 21,602/78 (the polymer used was No. 3 acrylamidimidazole copolymers; application rate of hydroquinone was 0.8 g/m²) and dried to obtain a photosensitive material for lithographic printing plate. The above-said silver halide emulsion contained $5 \times 10^{-6}$ mole of rhodium chloride for 1 mole of silver halide, which had been added during physical ripening of the emulsion. The silver halide grains, in substantially cubic form, were 0.3μ in average size and 90% or more of the total grains were distributed within ±30% of the average grain size.

Thirteen photosensitive materials for lithographic printing plate were prepared by repeating the above procedure, except that $3 \times 10^{-4}$ mole/mole-(silver halide) of each sensitizing dye shown in Table 1 was added to each silver halide emulsion.

The photosensitive material was exposed for $10^{-5}$ second to the radiation beam from a neon-helium laser device (Direct Scannergraph SG-606; Dainippon Screen Co.) through a gray contact screen (Dainippon Screen Co.) in close contact with the photosensitive material by means of a neutral gray wedge.

After exposure, the photographic material was developed with the following diffusion transfer developer.

| Transfer developer: | |
| --- | --- |
| Water | 700 ml |
| Potassium hydroxide | 20 g |
| Anhydrous sodium sulfite | 50 g |
| 2-Mercaptobenzoic acid | 1.5 g |
| 2-Methylaminoethanol | 15 g |

-continued

| Transfer developer: | |
|---|---|
| Made up with water to | 1 liter |

After development the material was passed through a pair of squeeze rolls to remove the excess developer, then immediately treated at 25° C. for 20 seconds with a neutralizer of the following composition, again passed through the squeeze rolls to remove the excess liquid, and dried.

| Neutralizer: | |
|---|---|
| Water | 600 ml |
| Citric acid | 10 g |
| Sodium citrate | 35 g |
| Colloidal silica, 20% solution | 5 ml |
| Ethylene glycol | 5 ml |
| Made up with water to | 1 liter |

The sensitivity, sharpness, and resolving power of each photosensitive material were as shown in Table 1. The sensitivity was evaluated by the photographic exposure required before the precipitation of the transferred silver had no more been observed and expressed as a relative value by assuming the sensitivity in the case of sensitizing dye No. 1 to be 1. The sharpness and resolving power were evaluated by using gray contact screens having 100, 133, 150, 175 and 200 lines/inch and observing the maximum number of lines per inch which had permitted a definite and distinct reproduction of tiny dots (5% dot). The results of evaluation were expressed in 5 grades of rating from grade 1 (100 lines/inch) to grade 5 (200 lines/inch).

TABLE 1

| Dye No. | Relative sensitivity | Resolving power | Printing endurance |
|---|---|---|---|
| 1 | 1.0 | 5 | 5 |
| 2 | 0.9 | 5 | 5 |
| 4 | 0.9 | 5 | 5 |
| 6 | 0.9 | 5 | 5 |
| 7 | 0.8 | 5 | 5 |
| 8 | 0.9 | 5 | 5 |
| A | 0.3 | 4 | 2 |
| B | 0.2 | 2 | 4 |
| C | 0.5 | 4 | 5 |
| D | 0.3 | 4 | 5 |
| E | 0.2 | 3 | 5 |
| F | 0.1 | 2 | 3 |
| G | 0.6 | 4 | 5 |

The lithographic printing plate obtained by use of the contact screen from the photosensitive material which showed the resolving power as shown in Table 1 was mounted on an offset press, then applied with the following etch solution all over the plate surface, and printing was run using the following fountain solution.

| Etch solution: | |
|---|---|
| Water | 600 ml |
| Isopropyl alcohol | 400 ml |
| Ethylene glycol | 50 g |
| 3-Mercapto-4-acetamido-5-n-heptyl-1,2,4-triazole | 1 g |
| Fountain solution: | |
| Orthophosphoric acid | 10 g |
| Nickel nitrate | 5 g |
| Sodium sulfite | 5 g |
| Ethylene glycol | 100 g |
| Colloidal silica, 20% solution | 28 g |
| Made up with water to | 2 liters |

The press employed was A. B. Dick 350 CD (Trademark of an offset press supplied by A. B. Dick Co.). The printing endurance shown in Table 1 was evaluated in terms of the number of copies delivered before the printing had become impossible owing to the occurrence of scumming or partial disappearance of silver image, and expressed in grade number rated in accordance with the following criteria.

| Grade No. | Number of copies |
|---|---|
| 1 | <4,000 |
| 2 | 4,000–6,000 |
| 3 | 6,000–8,000 |
| 4 | 8,000–10,000 |
| 5 | >10,000 |

It is seen from the above results that although carrying tiny dots, the present lithographic printing plate had a high printing endurance. It was also confirmed that the unexposed lithographic printing plate of this invention is very stable, retaining its characteristics after having been stored for a long period of time.

EXAMPLE 2

A silver halide emulsion was prepared in the same manner as in Example 1, except that silver chloride having an average grain size of 0.45μ was used as the silver halide emulsion. Using the emulsion, eight photosensitive materials were prepared in the same manner as in Example 1, except that each $3 \times 10^{-4}$ mole of the sensitizing dyes shown in Table 2 was added to the emulsion for 1 mole of silver halide contained therein. Each photosensitive material was exposed for $10^{-7}$ second to the radiation beam (maximum radiation wave length in the range of about 670 to about 680 nm) from a scanner-type LED device. The exposed material was treated and printing was run in the same manner as in Example 1. The results were as shown in Table 2.

TABLE 2

| Dye No. | Relative sensitivity | Resolving power | Printing endurance |
|---|---|---|---|
| 1 | 1.0 | 5 | 5 |
| 2 | 1.0 | 5 | 5 |
| 4 | 1.0 | 5 | 5 |
| 7 | 0.9 | 5 | 5 |
| 8 | 0.9 | 5 | 5 |
| A | 0.3 | 5 | 2 |
| B | 0.3 | 3 | 4 |
| C | 0.4 | 4 | 5 |

EXAMPLE 3

Four emulsions were prepared in the same manner as in Example 2, except that silver chlorobromide or silver bromide containing 5, 25, 50, or 100 mole-% of silver bromide was used in place of the silver chloride. In a manner similar to that in Example 2, four lithographic printing plates were prepared by using the above emulsion and the sensitizing dye No. 1, and the printing test was run. The results obtained were as shown in Table 3.

TABLE 3

| Silver bromide content (mole %) | Relative sensitivity | Resolving power | Printing endurance |
|---|---|---|---|
| 0 (Example 2) | 1.0 | 5 | 5 |
| 5 | 1.2 | 5 | 5 |
| 25 | 0.9 | 5 | 4 |
| 50 | 0.7 | 3 | 3 |
| 100 | 0.6 | 2 | 2 |

What is claimed is:

1. A process for making a lithographic printing plate, which comprises imagewise exposing to the radiation from a neon-helium laser or a light-emitting diode a photosensitive element comprising at least emulsion layer of silver halide containing 70 mol-% or more of silver chloride and surface layer containing physical development nuclei, said emulsion layer being spectrally sensitized with an anion- or betaine-type meso-substituted trimethine cyanine dye having at least one $\beta$-naphthothiazole nucelus represented by the general formula (I)

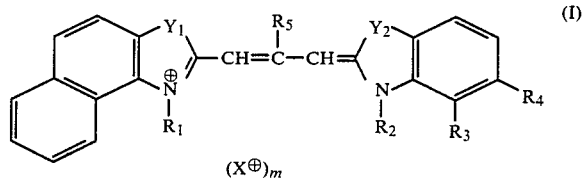

where $R_1$ and $R_2$ each represents an alkyl group, an alkenyl group, an aryl group, or an aralkyl group, at least one of $R_1$ and $R_2$ is a group having a sulfo or carboxyl group; $R_3$ and $R_4$ each represents a hydrogen atom, an alkyl group, an alkoxy group, an aryl group, a hydroxyl group, an alkoxycarbonyl group, or a halogen atom, $R_3$ and $R_4$ may jointly form a benzene ring; $R_5$ represents an alkyl group, an aryl group, or an aralkyl group; $Y_1$ and $Y_2$ each represents a sulfur or selenium atom, provided that $Y_1$ and $Y_2$ are not simultaneously a selenium atom; X represents a cationic form of a hydrogen atom, an alkali metal atom, or an ammonium group; and m is 1 or 0, and developing the exposed element by the silver complex diffusion transfer process.

2. A process according to claim 1, wherein at least one of $R_1$ and $R_2$ is a sulfoalkyl group having 1 to 5 carbon atoms.

3. A process according to claim 1, wherein the dye is used in an amount of $1 \times 10^{-5}$ to $1 \times 10^{-2}$ mole for 1 mole of the silver halide.

4. A process according to claim 1, wherein the silver halide comprises at least 80 mole-% of silver chloride.

5. A process according to claim 1, wherein the silver halide has an average grain size of 0.2 to 0.6 $\mu$m.

6. A process according to claim 1, wherein the silver halide emulsion contains a compound of metals of Group VIII of the periodic table.

7. A process according to claim 1, wherein an antihalation layer is provided under the silver halide emulsion layer.

8. A process according to claim 1, wherein the photosensitive element is exposed to the neon-helium layer beam.

9. A printing process which comprises applying a printing ink to the silver image formed on the surface layer of the lithographic printing plate obtained according to claim 1.

* * * * *